(12) United States Patent  (10) Patent No.: US 7,713,859 B2
Richardson et al.  (45) Date of Patent: May 11, 2010

(54) TIN-SILVER SOLDER BUMPING IN ELECTRONICS MANUFACTURE

(75) Inventors: Thomas B. Richardson, Killingworth, CT (US); Marlies Kleinfeld, Wuppertal (DE); Christian Rietmann, Sonsbeck (DE); Igor Zavarine, New Haven, CT (US); Ortrud Steinius, Wuppertal (DE); Yun Zhang, Warren, NJ (US); Joseph A. Abys, Warren, NJ (US)

(73) Assignee: Enthone Inc., West Haven, CT (US)

( * ) Notice: Subject to any disclaimer, the term of this patent is extended or adjusted under 35 U.S.C. 154(b) by 320 days.

(21) Appl. No.: 11/463,355

(22) Filed: Aug. 9, 2006

(65) Prior Publication Data

US 2007/0037377 A1 Feb. 15, 2007

Related U.S. Application Data

(60) Provisional application No. 60/708,328, filed on Aug. 15, 2005.

(51) Int. Cl.
*H01L 33/62* (2010.01)
(52) U.S. Cl. ............... 438/613; 257/772; 257/779; 257/E21.508; 257/E23.026
(58) Field of Classification Search ......... 257/E21.508, 257/772, 779, E23.026; 438/613
See application file for complete search history.

(56) References Cited

U.S. PATENT DOCUMENTS

| | | | |
|---|---|---|---|
| 4,293,391 A | | 10/1981 | Canaris |
| 4,459,185 A | * | 7/1984 | Obata et al. ............ 205/254 |
| 4,572,743 A | * | 2/1986 | Muller et al. ............ 134/3 |
| 4,582,576 A | | 4/1986 | Opaskar et al. |
| 4,715,894 A | | 12/1987 | Holtzman et al. |
| 4,749,626 A | | 6/1988 | Kadija et al. |
| 4,935,312 A | | 6/1990 | Nakayama et al. |
| 6,099,713 A | | 8/2000 | Yanada et al. |
| 6,361,823 B1 | | 3/2002 | Bokisa et al. |
| 6,607,653 B1 | | 8/2003 | Tsuji et al. |
| 6,638,847 B1 | | 10/2003 | Cheung et al. |
| 6,773,568 B2 | | 8/2004 | Egli et al. |
| 6,998,036 B2 | | 2/2006 | Dietterle et al. |
| 7,029,761 B2 | | 4/2006 | Kawaguchi et al. |
| 7,045,050 B2 | | 5/2006 | Tanaka et al. |
| 7,056,448 B2 | | 6/2006 | Okuhama et al. |
| 2003/0000846 A1 | | 1/2003 | Rzeznik et al. |
| 2004/0253804 A1 | | 12/2004 | Beica et al. |
| 2005/0184369 A1 | | 8/2005 | Sonoda et al. |

OTHER PUBLICATIONS

International Search Report, PCT/US2006/031618, dated Jan. 25, 2008, 3 pages.

(Continued)

*Primary Examiner*—Anh Phung
*Assistant Examiner*—Michael Lulis
(74) *Attorney, Agent, or Firm*—Senniger Powers LLP

(57) ABSTRACT

A process for forming a solder bump on an under bump metal structure in the manufacture of a microelectronic device comprising exposing the under bump metal structure to an electrolytic bath comprising a source of $Sn^{2+}$ ions, a source of $Ag^+$ ions, a thiourea compound and/or a quaternary ammonium surfactant; and supplying an external source of electrons to the electrolytic bath to deposit a Sn—Ag alloy onto the under bump metal structure.

28 Claims, 7 Drawing Sheets

OTHER PUBLICATIONS

Written Opinion, PCT/US2006/031618, dated Jan. 25, 2008, 8 pages.
International Preliminary Report on Patentability, PCT/US2006/031618, dated Mar. 17, 2009, 7 pages.
Trimble, Russell, "Comparison of the Reactions of Amidinourea and Amidinothiourea with Various Metal Ions", Analytical Chemistry, vol. 34, No. 12, Nov. 1962, pp. 1633-1635.
De Marco et al., "Thermodynamics of Complex-Formation of Ag(I) Part 10. Investigations on Complex Equilibria Between Ag(I) and Thioureas in Ethanol", Thermochimica Acta, 1994, vol. 246 No. 1, pp. 229-242.
European Search Report, European Patent Application No. 06801412.5, Dec. 4, 2009, 12 pages.

* cited by examiner

TIN-SILVER SOLDER BUMPING IN ELECTRONICS MANUFACTURE

CROSS-REFERENCE TO RELATED APPLICATION

This application claims the benefit, of U.S. Provisional Application Ser. No. 60/708,328, filed Aug. 15, 2005.

FIELD OF THE INVENTION

This invention relates to electroplating baths and methods for plating tin-based alloys, and more specifically, the invention relates to tin-silver (Sn—Ag) alloy solder wafer bumping in the manufacture of microelectronic devices.

BACKGROUND OF THE INVENTION

Solder wafer bumps conventionally comprise solders of the tin-lead (Sn—Pb) alloy group. The Sn—Pb solders may be formed in a variety of compositions including the low melting eutectic comprising 63% Sn and 37% lead. High Sn alloys are called fine solders and are used extensively in electrical work. Many Sn—Pb alloy compositions exhibit broad pasty temperature ranges which enhance their workability.

Recent regulatory and environmental developments have increased interest in Pb-free solders. Accordingly, pure Sn, Sn—Cu, Sn—Bi, Sn—Ag, and ternary Sn alloys have been explored as potential alternatives to Sn—Pb alloys. Of particular interest are the Sn—Ag alloys because of their performance advantages such as low resistivity, stability, the ability to achieve a wide range of melting points, and the elimination of alpha particle emissions by using pure Sn sources.

A particular problem associated with the use of Ag in Sn—Ag alloy solder wafer bumping is associated with the spontaneous reduction of Ag ions from the electroplating bath. For example, Ag ions, being very noble, have a tendency toward immersion/displacement plating upon exposure to certain UBM layers, particularly Cu layers. Accordingly, precise control of the Ag ion concentration in the electroplating solution and therefore control of the Ag metal content and uniformity in the Sn—Ag solder wafer bump is rendered difficult. There is a need for a plating method which allows for control of the Ag ion content in solution, and thus control of the Ag metal content in the alloy solder wafer bump.

Another problem facing microelectronic device manufacturers using Sn—Ag alloy solder wafer bumps is low throughput due to the limited current densities which may be achieved using conventional electroplating baths. For example, in U.S. Pat. No. 6,638,847, it was reported that current densities appropriate for electroplating Sn-based alloys, include Sn—Ag, were in the range of 3-5 ASD. Kim et al. report current densities for plating a Sn—Ag solder using thiourea as a complexing agent in the range of 1 to 3 ASD. See *Effects of Electroplating Parameters on Composition of Sn—Ag Solder*, J. Electronic Materials, December 2004. Accordingly, there is a need for a plating composition which can plate at high current densities to achieve higher throughput.

SUMMARY OF THE INVENTION

Among the various aspects of the present invention may be noted the provision of electrolytic plating baths and methods for plating Sn—Ag alloy solder wafer bumps, the baths being characterized by additives which enhance the stability of $Ag^+$ ions in solution, allow for plating at high current densities, and plate Sn—Ag wafer bumps with substantially reduced or entirely eliminated voiding between the bumps and Cu UBM.

Briefly, therefore, the present invention is directed to a process for forming a solder bump comprising exposing an under bump metal structure to an electrolytic bath comprising a source of $Sn^{2+}$ ions, a source of $Ag^+$ ions, and an N-allylthiourea compound, and supplying an external source of electrons to the electrolytic bath to deposit a Sn—Ag alloy onto the under bump metal structure.

The invention is also directed to a process for forming a solder bump comprising exposing an under bump metal structure to an electrolytic bath comprising a source of $Sn^{2+}$ ions, a source of $Ag^+$ ions, and a quaternary ammonium surfactant; and supplying an external source of electrons to the electrolytic bath to deposit a Sn—Ag alloy onto the under bump metal structure.

The invention is also directed to a process for forming a solder bump comprising exposing an under bump metal structure to an electrolytic bath comprising a source of $Sn^{2+}$ ions, a source of $Ag^+$ ions, and an amidinothiourea compound; and supplying an external source of electrons to the electrolytic bath to deposit a Sn—Ag alloy onto the under bump metal structure.

In another aspect the invention is directed to a process for forming a Sn—Ag electrolytic bath for deposition of solder bumps, the process comprising combining a source of $Ag^-$ ions with a complexor for $Ag^+$ ions and water to form a bath precursor comprising Ag complex in a substantial absence of any source of $Sn^{+2}$ ions; and adding a source of $Sn^{+2}$ ions to the bath precursor comprising the Ag complex.

In another aspect the invention is directed to an electroplating composition for plating a Sn—Ag solder bump comprising a source of $Sn^{2+}$ ions, a source of $Ag^+$ ions, an N-allylthiourea compound, and a quaternary ammonium surfactant; and also to an electroplating composition for plating a Sn—Ag solder bump comprising a source of $Sn^{2+}$ ions; a source of $Ag^+$ ions; an amidinothiourea compound; and a quaternary ammonium surfactant.

Other objects and features of the invention will be in part apparent and in part pointed out hereinafter.

DETAILED DESCRIPTION OF THE PREFERRED EMBODIMENT(S)

Figure 1A:
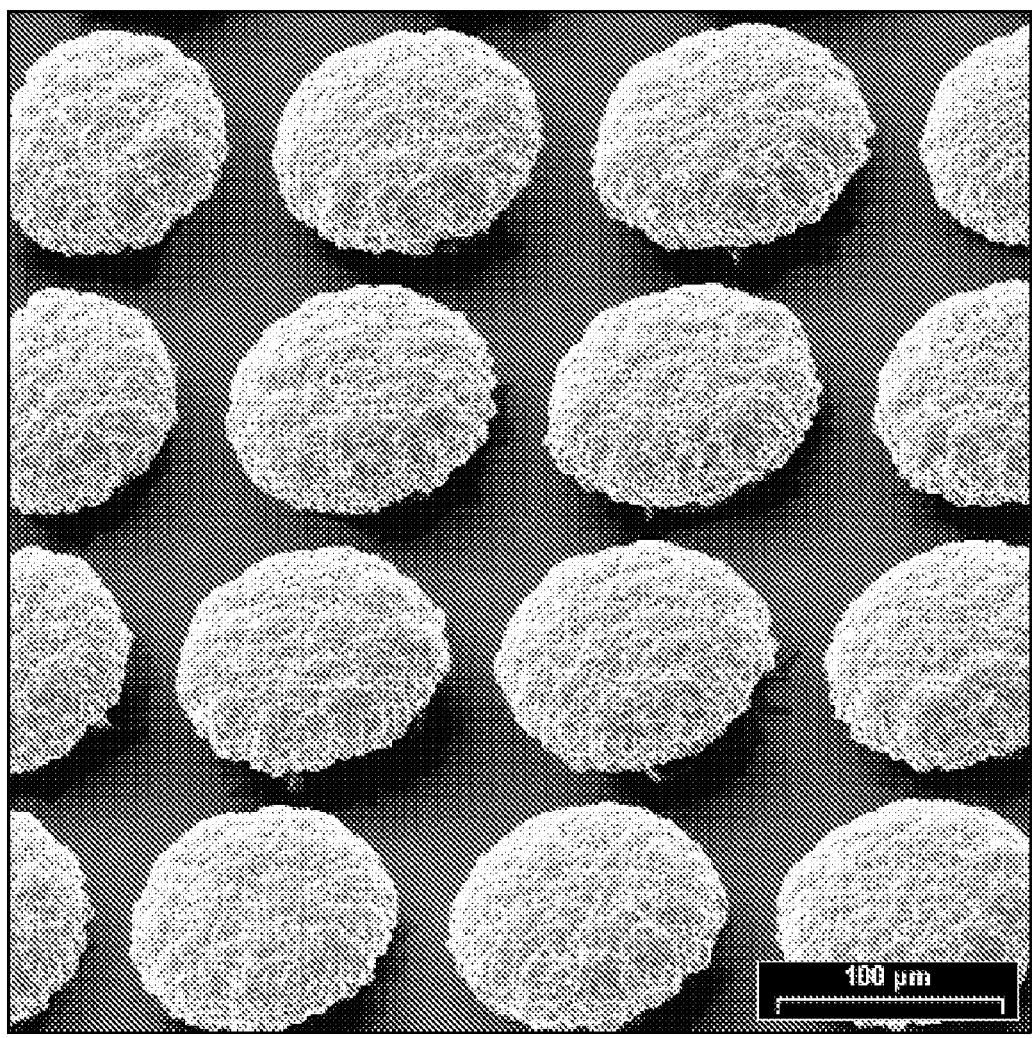
FIGS. 1A, 1B, and 1C are SEM photographs of solder bumps prepared according to the method described in Example 11.

In accordance with the present invention, Sn—Ag alloy solder bumps are deposited from an electroplating bath onto an under bump metal structure, such as a silicon wafer substrate overlaid by metallization layers, for use in the manufacture of a microelectronic device. For example, Sn—Ag alloy solder bumps can be deposited having uniform bump heights, uniform Ag content and distribution in the bumps, and good reflow characteristics. Advantageously, the electroplating bath exhibits good stability with respect to Ag immersion/displacement of the Cu under bump metal or soluble Sn anode and plates the Sn—Ag alloy at high current densities. For example, in practice, the plating baths can plate a Sn—Ag alloy at current densities up to 20 amps per square decimeter (Amp/dm$^2$, hereinafter "ASD") with substantially no Ag displacement on Cu UBM or soluble Sn anode. Surprisingly, the plating baths plate Sn—Ag alloy bumps with substantially reduced or eliminated voiding between the bumps and Cu UBM. The invention is described herein in the context of Sn—Ag alloy solder bumps on microelectronic device substrates, which solder bumps are deposited in patterns to yield, for example, the pattern of as-deposited bumps shown in FIGS. 1A, 1B, and 1C. These bumps are reflowed to yield the pattern of reflowed bumps shown in FIGS. 2A, 2B, and 2C. However, the nature of the substrate as an electronic device substrate is not critical to the applicability of the invention.

The present invention stems from the discovery that certain additives to a Sn—Ag electroplating bath increase Ag$^+$ ion stability and allow plating at high current densities. The discovered additives substantially reduce the aforementioned problem of spontaneous reduction of Ag$^+$ ion onto unintended surfaces, which had detracted from bath stability and uniformity in Sn—Ag proportions in the intended deposits. In one embodiment, to enhance Ag$^+$ ion stability and extend the usable current densities and thereby achieve these advantages, an N-allyl thiourea compound which strongly complexes Ag$^+$ ions is included in the bath. One particular such compound is an N-allyl-N'-hydroxyalkyl thiourea compound. In one embodiment, the alkyl group is ethyl, and the hydroxyl group is in the β position on the ethyl group. This compound, N-allyl-N'-β-hydroxyethyl-thiourea, is hereinafter referred to as "HEAT". The N-allyl thiourea compound which strongly complexes Ag$^+$ ions substantially inhibits Ag$^+$ ion displacement onto the Cu UBM and soluble Sn anode. In one embodiment, Ag$^+$ ion stability is enhanced by including in the bath an amidinothiourea compound which also strongly complexes Ag$^+$ ions. In one preferred embodiment, the amidinothiourea compound is amidinothiourea.

The formation of the stable silver complex reduces the reduction potential closer to that of Sn$^{2+}$, such that the current density is not limited by the otherwise rapid Ag$^+$ ion diffusion rate. Instead, the current density is limited by the diffusion rate of Sn$^{2+}$ ions, which are present typically in such high concentrations, up to about 50 g/L to about 60 g/L or more, that very high current densities can be employed.

Selected N-allyl thiourea compounds act to increase the solubility of Ag$^+$ ions in the bath by forming complexes with Ag$^+$ ions at acidic pH and to inhibit displacement reactions between Ag$^+$ ions and Cu UBM or soluble Sn anode. Additionally, these N-allyl thiourea compounds shift the Ag$^+$ reduction potential closer to the reduction potential of Sn$^{2+}$, allowing for plating at high current densities. Exemplary N-allyl thiourea compounds include N-allyl thiourea, and HEAT. In selecting a suitable N-allyl thiourea compound, compounds which are unable to result in a water soluble complex with Ag$^+$ ions at acidic pH or are toxic are avoided. Based on the HSAB (hard-soft-acid-base) concept and Pi-back bonding of sulfur-containing compounds, it is thought that N-allyl thiourea compounds, such as HEAT, are useful additives for forming complexes with Ag$^+$ ions resulting in tetrahedral complexes with bridged 2e-3 center bonding between Ag—S—Ag. In general, suitable N-allyl thiourea compounds shown below in the following general structure (1):

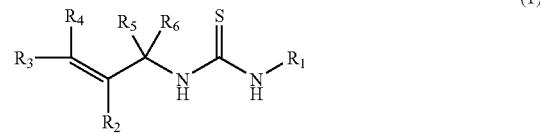

wherein $R_1$, $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl.

Where any of $R_1$, $R_2$, $R_3$, $R_4$, $R_5$, and $R_6$ are heterocycloalkyl or heteroaryl, the ring substituent may comprise O, S, or N atoms. Exemplary substituents on the substituted R groups include halide, hydroxyl, alkoxy, aryl, heteroaryl, nitro, cyano, and mercaptan. In one preferred embodiment, $R_2$, $R_3$, $R_4$, $R_5$, and $R_6$ are hydrogen. In another preferred embodiment, $R_1$, $R_2$, $R_3$, $R_4$, $R_5$, and $R_6$ are hydrogen, and the compound is N-allyl thiourea. In a particularly preferred embodiment, $R_2$, $R_3$, $R_4$, $R_5$, and $R_6$ are hydrogen and $R_1$ is —CH$_2$CH$_2$OH (β-hydroxyethyl), and the N-allyl thiourea compound is HEAT, which has the following structure (2):

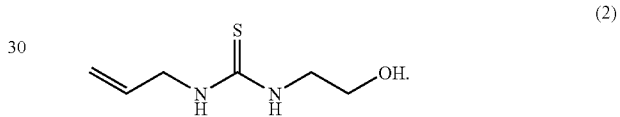

Selected amidinothiourea compounds act to increase the solubility of Ag$^+$ ions in the bath by forming complexes with Ag$^+$ ions at acidic pH and to inhibit displacement reactions between Ag$^+$ ions and Cu UBM or soluble Sn anode. In selecting a suitable amidinothiourea compound, compounds which are unable to result in a water soluble complex with Ag$^+$ ions at acidic pH or are toxic are avoided. The general formula of suitable amidinothiourea compounds are shown below in the following formula (3):

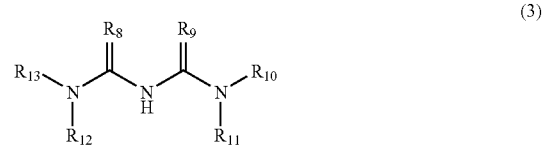

wherein $R_8$ and $R_9$ are either sulfur or nitrogen, and when $R_8$ is sulfur, $R_9$ is nitrogen and when $R_8$ is nitrogen, $R_9$ is sulfur; and $R_{10}$, $R_{11}$, $R_{12}$, and $R_{13}$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl.

Exemplary substituents on the substituted $R_{10}$, $R_{11}$, $R_{12}$, and $R_{13}$ include halide, hydroxyl, alkyl, alkoxy, aryl, heteroaryl, nitro, cyano, and mercaptan. In one preferred embodiment, $R_{10}$, $R_{11}$, $R_{12}$, and $R_{13}$ are all hydrogen, and the amidinothiourea compound is amidinothiourea, which has the following structure (4):

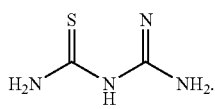
(4)

In the baths of the present invention, the concentration of the N-allyl-thiourea compound or amidinothiourea compound is between about 0.5 g/L and about 24 g/L. Employing too much of the compound causes decomposition to free thiourea derivative. Employing too little results in insufficient complexing of Ag. In one embodiment, the concentration is at least about 1 g/L, such as about 1.4 g/L, about 1.5 g/L, about 1.75 g/L, or about 2.2 g/L. In one embodiment, the concentration is no greater than about 8 g/L, such as about 8 g/L, about 6 g/L, about 4 g/L, or about 3 g/L. In one embodiment, between about 0.5 g/L and about 16 g/L of HEAT is added to complex $Ag^+$ ions and enhance their solubility, while also inhibiting displacement reactions between $Ag^+$ ions and Cu UBM or soluble Sn anode. In one embodiment, between about 0.5 g/L and about 16 g/L, such as between about 1 and about 8 g/L of amidinothiourea is added to complex $Ag^+$ ions and enhance their solubility.

Silver immersion plating (also known as "displacement" plating) occurs in electroplating baths spontaneously due to high nobility of $Ag^+$ ions. The reduction of Ag is described by the following reaction:

$$Ag^+ + e^- \rightarrow Ag \quad E° = +0.80 \text{ V v. S.H.E.} \quad (1)$$

The positive value of E° for the reaction indicates the very positive redox potential of $Ag^+$. $Cu^{2+}$ and $Sn^{4+}$ are less noble than $Ag^+$ as shown by the lower reduction potentials of the following reduction reactions:

$$Cu^{2+} + 2e^- \rightarrow Cu \quad E° = +0.34 \text{ V v. S.H.E.} \quad (2)$$

$$Sn^{4+} + 2e^- \rightarrow Sn^{2+} \quad E° = +0.15 \text{ V v. S.H.E.} \quad (3)$$

Accordingly, upon exposure of aqueous $Ag^+$ ions to aqueous $Sn^{2+}$ ions and/or Cu UBM, $Ag^+$ ions spontaneously oxidize $Sn^{2+}$ ions to $Sn^{4+}$ ions and Cu metal to $Cu^{2-}$ ions. Concurrently, $Ag^+$ ions are reduced to Ag metal, which may become a finely divided metal floating in solution or deposit spontaneously on the substrate, walls of the plating tank, or soluble Sn anode. Spontaneous $Ag^+$ ion displacement plating renders difficult control of the concentration of $Ag^+$ ions in the electroplating bath, which is a severe limitation in the use of Ag in electroplating alloys, such as in Sn-based solder wafer bumps. Accordingly, the thiourea compounds, such as HEAT and amidinothiourea, are added to the Sn—Ag electroplating bath to complex $Ag^+$ ions and thereby control both the solubility and stability of $Ag^+$ ions in the plating bath. Advantageously, HEAT and amidinothiourea also lower the reduction potential of $Ag^+$ ions, bringing that potential closer to the reduction potential of $Sn^{2+}$ ions, which allows for better control of the concentration and uniformity of Ag metal in the Sn—Ag alloy solder wafer bump and allows for plating at high current densities.

To further enhance the effect of thiourea compounds for extending the usable current density range, certain quaternary ammonium surfactants are added to the bath in the currently preferred embodiment. The quaternary ammonium surfactants which have been found useful for adding to the plating baths of the present invention include alkyl dimethyl benzyl ammonium salts in which the alkyl group is between 10 and 18 carbons long, preferably the alkyl group is 12 to 14 carbons long. The alkyl group may be substituted or unsubstituted. A particularly preferred quaternary ammonium surfactant is a C12/C14 dimethyl benzyl ammonium chloride salt sold under the trade name Dodigen 226, which comprises lauryl dimethyl benzyl ammonium chloride salt and myristyl dimethyl benzyl ammonium chloride salt. Advantageously, this compound acts additionally as a grain refiner and prevents nodular growth. The quaternary ammonium surfactants further extend the useful current density range, act as grain refiners, and inhibit nodular growth. Without being bound to a particular theory, it is thought that the quaternary ammonium surfactants further extend the current density range because the salts can bind both $Sn^{2+}$ and $Ag^+$ ions, thus inhibiting diffusion of those metal ions and allowing the plating current density range to be extended.

In the baths of the present invention, the concentration of quaternary ammonium surfactant is between about 0.1 g/L and about 20 g/L, preferably between about 0.8 and about 15 g/L, such as about 0.8 g/L, about 1.6 g/L, or about 2.0 g/L. For example, between about 0.5 g/L and about 10 g/L of Dodigen 226 may be added to extend the useful current density range, refine the grain size, and prevent nodular growth in the Sn—Ag solder wafer bump. Employing too much of the compound causes bath instability and increased nodule formation at the center of wafers. Employing too little results in insufficient suppression of high current density plating, and therefore increases the risk of nodule growth at high current density areas.

In conventional Sn—Ag electroplating baths, the plating rate is limited to low current densities. Typically, the current densities practically achievable in conventional plating baths are no greater than about 1 ASD. Limited current densities adversely affect plating throughput. Conventional baths are limited to such low current densities because of rapid diffusion rate of $Ag^+$ ions in the bath. The electroplating baths of the current invention comprising thiourea compounds, such as HEAT and amidinothiourea, and quaternary ammonium surfactant salts, such as Dodigen 226, can be plated at current densities up to about 20 ASD. By incorporating these additives, the increased solubility and stability of $Ag^+$ ions in the bath largely remove $Ag^+$ ion diffusion rate as an overall rate limiting aspect, and makes it so $Sn^{2+}$ diffusion rate is the overall rate limiting aspect. Since the $Sn^{2+}$ ion concentration is in the range of about 50 g/L to about 60 g/L, the diffusion rate limited current is much higher. Taking advantage of this discovery, the process of the invention employs a current density of greater than about 4 ASD. One preferred embodiment employs a current density of greater than 8 ASD, and another preferred high-throughput embodiment employs a current density of more than 10 ASD.

Among other components of the bath may be added a source of $Sn^{2+}$ ions, a source of $Ag^+$ ions, an anti-oxidant, and a surfactant.

The source of $Sn^{2+}$ ions may be a soluble anode comprising a $Sn^{2+}$, or, where an insoluble anode is used, a soluble $Sn^{2+}$. In both cases, the $Sn^{2+}$ salt is $Sn(CH_3SO_3)_2$ (Tin methane sulfonic acid, hereinafter "$Sn(MSA)_2$") in one preferred embodiment. $Sn(MSA)_2$ is a preferred source of $Sn^{2+}$ ions because of its high solubility. Additionally, the pH of Sn—Ag plating baths of the present invention may be lowered using methane sulfonic acid, and the use of $Sn(MSA)_2$ as the Sn source rather than, e.g., Sn(X), avoids the introduction of unnecessary additional anions, e.g., $X^{2-}$, into the plating baths, especially those that render $Ag^+$ substantially insoluble. Typically, the concentration of the source of $Sn^{2+}$ ions is sufficient to provide between about 10 g/L and about 100 g/L of $Sn^{2+}$ ions into the bath, preferably between about 15 g/L and about 95 g/L, more preferably between about 40 g/L and about 60 g/L. For example, $Sn(MSA)_2$ may be added to provide between about 30 g/L and about 60 g/L $Sn^{2+}$ ions to the plating bath.

$Ag^+$ ions are sparingly soluble with most anions. Therefore, the source of $Ag^+$ ions is limited to salts of nitrate, acetate, and preferably methane sulfonate. Typically, the concentration of the source of $Ag^+$ ions is sufficient to provide between about 0.1 g/L and about 1.5 g/L of $Ag^+$ ions into the bath, preferably between about 0.3 g/L and about 0.7 g/L, more preferably between about 0.4 g/L and about 0.6 g/L. For example, Ag(MSA) may be added to provide between about 0.2 g/L and about 1.0 g/L $Ag^+$ ions to the plating bath.

Anti-oxidants may be added to the baths of the present invention to stabilize the bath against oxidation of $Sn^{2+}$ ions in solution. In the electroplating baths for plating Sn—Ag alloy solder wafer bumps, $Ag^+$ ions, being nobler than $Sn^{2+}$, can spontaneously oxidize $Sn^{2+}$ to $Sn^{4+}$, as explained above. This spontaneous redox reaction can cause Ag metal to deposit on the Cu UBM, the walls of the plating tank, or the soluble Sn anode, and to form finely divided Ag metal particles in solution. Additionally, reduction of $Sn^{4+}$, which forms stable hydroxides and oxides, to Sn metal, being a 4-electron process, slows the reaction kinetics. Although HEAT and other thiourea compounds may be added to the bath to prevent the spontaneous reduction of $Ag^+$/oxidation of $Sn^{2+}$, it is preferable to add an anti-oxidant to the bath to further stabilize the bath against this redox reaction. Accordingly, preferred anti-oxidants such as hydroquinone, catechol, and any of the hydroxyl, dihydroxyl, or trihydroxyl benzoic acids may be added in a concentration between about and about, preferably between about 0.1 g/L and about 10 g/L, more preferably between about 0.5 g/L and about 3 g/L. For example, hydroquinone may be added to the bath at a concentration of about 2 g/L.

Surfactants may be added to promote wetting of the under bump metal structure and resist material and enhance the deposition of the wafer bumps. The surfactant seems to serve as a mild deposition inhibitor which can suppress three-dimensional growth to an extent, thereby improving morphology and topography of the film. It can also help refine the grain size, which yields a more uniform bump. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates. A particularly preferred anionic surfactant is Ralufon NAPE 14-90 (available from Raschig GmbH, Ludwigshafen, Germany) which is a sulfonated β-naphthol propoxylate/ethoxylate having a block of propylene oxide units bonded to the β-naphthol hydroxyl group, a block of ethylene oxide units bonded to the propylene oxide block, and a terminal propane sulfonate group. Exemplary cationic surfactants include quaternary ammonium salts such as dodecyl trimethyl ammonium chloride, cetyl trimethyl ammonium chloride, and the like. Exemplary non-ionic surfactants include glycol and glycerol esters, polyethylene glycols, and polypropylene glycol/polyethylene glycol. Preferred non-ionic surfactants include β-naphthol derivatives, such as β-naphtholethoxylates having between 1 and about 24 ethylene oxide monomer units bonded to the β-naphthol hydroxyl group, more preferably between about 8 and about 16 ethylene oxide monomer units. A particularly preferred non-ionic surfactant is Lugalvan BNO12 which is a β-naphtholethoxylate having 12 ethylene oxide monomer units bonded to the naphthol hydroxyl group.

The surfactant can be present in the electroplating bath at a concentration between about 0.1 g/L and about 50 g/L, preferably between about 5 g/L and about 20 g/L.

The electrolytic plating bath of the present invention preferably has an acidic pH to inhibit anodic passivation, achieve better cathodic efficiency, and achieve a more ductile deposit. Accordingly, the bath pH is preferably between about 0 and about 3. In the preferred embodiment the pH of the bath is 0. The choice of acids is limited by the poor solubility or substantial insolubility of most Ag salts. Accordingly, the preferred acidic pH can be achieved using nitric acid, acetic acid, and methane sulfonic acid. In one preferred embodiment, the acid is methane sulfonic acid. The concentration of the acid is preferably between about 50 g/L and about 200 g/L, more preferably between about 70 g/L and about 120 g/L. For example, between about 50 g/L and about 160 g/L methane sulfonic acid can be added to the electroplating bath to achieve a bath of pH 0 and act as the conductive electrolyte.

The electroplating baths of the present invention are preferably employed to plate Sn—Ag alloy solder wafer bumps on Cu UBM in the manufacture of microelectronic devices, such as printed wiring boards (PWB). However, the plating baths may be used in any application requiring a Sn-based solder wafer bump. Advantageously, the plating baths may plate at high rates due to the stability of the bath and the high current densities which may be applied.

In one application for the invention, the goal of the process is to yield the product of FIGS. 1 and 2, which is an electronic device substrate with individual solder bumps thereon. With regard to the specific process, a first step is substrate preparation. The substrate preparation is not narrowly germane to the present invention; but to place the invention in context, it is noted that the invention falls within the following overall context proceeding from substrate preparation through inspection:

1) receiving photoresist patterned wafer with a sputtered Cu seed layer or Cu UBM (thickness of this layer is normally between 300 Å and 3000 Å)
2) deposit a second UBM layer to prevent diffusion of Cu into solder bumps such as SnAg (thickness of this layer is normally 1 to 3 microns)
3) deposit solder bumps such as SnAg, normally into mushroom shape (bump height varies from about 50 microns to 100 microns)
4) strip off photoresist
5) etch off Cu UBM
6) reflow SnAg bumps
7) inspect and characterization such as bump height and Ag alloy uniformity measurements, voiding analysis, etc.

During the electrolytic plating operation of the invention for bumping, the plating solution is preferably maintained at a temperature between about 15° C. and about 50° C. In one preferred embodiment, the temperature is between about 25° C. and about 35° C. The substrate is immersed in or otherwise exposed to the plating bath. The current density applied is between about 1 $A/dm^2$ and about 20 $A/dm^2$, preferably between about 1 $A/dm^2$ and about 16 $A/dm^2$ as described above. At these current densities, the plating rate is between about 1 μm/min and about 10 μm/min. Typically, the thickness of the electrolytically deposited Sn—Ag alloy solder wafer bump is between about 10 μm and about 100 μm which, in view of the foregoing plating rates, corresponds to the substrate being immersed in the solution for a duration between about 10 minutes and about 30 minutes.

The anode may be a soluble anode or insoluble anode. If a soluble anode is used, the anode preferably comprises $Sn(MSA)_2$, such that the source of $Sn^{2+}$ ions in the plating bath is the soluble anode. Use of a soluble anode is advantageous because it allows careful control of the $Sn^{2+}$ ion concentration in the bath, such that the $Sn^{2+}$ ion does not become either under- or over-concentrated. An insoluble anode may be used instead of a Sn-based soluble anode. Preferable insoluble anodes include Pt/Ti, Pt/Nb, and DSAs (dimensionally stable anodes). If an insoluble anode is used, the $Sn^{2+}$ ions are introduced as a soluble $Sn^{2+}$ salt.

During the plating operation, $Sn^{2+}$ ions and $Ag^+$ ions are depleted from the electrolytic plating solution. Rapid depletion can occur especially with the high current densities achievable with the plating baths of the present invention. Therefore, $Sn^{2+}$ ions and $Ag^+$ ions may be replenished according to a variety of methods. If a Sn-based soluble anode is used, the $Sn^{2+}$ ions are replenished by the dissolution of the anode during the plating operation. If an insoluble anode is used, the electrolytic plating solution may be replenished according to continuous mode plating methods or use-and-dispose plating methods. In the continuous mode, the same bath volume is used to treat a large number of substrates. In this mode, reactants must be periodically replenished, and reaction products accumulate, necessitating periodic filtering of the plating bath. Alternatively, the electrolytic plating compositions according to the present invention are suited for so-called "use-and-dispose" deposition processes. In the use-and-dispose mode, the plating composition is used to treat a substrate, and then the bath volume is directed to a waste stream. Although this latter method may be more expensive, the use-and-dispose mode requires no metrology; that is, measuring and adjusting the solution composition to maintain bath stability is not required.

After electroplating of the SnAg solder bumps is complete, flux is generously applied with a spray to coat the entire wafer. Preferably, sufficient flux is applied to impregnate every bump with flux. After application of flux, the bumps may be reflowed according to methods known in the art.

Electroplating baths of the present invention are advantageously stable to spontaneous $Ag^+$ ion reduction and can be plated at current densities which are higher than those achievable by conventional plating baths. The electroplating baths can be used to plate Sn—Ag alloys having Ag metal content between about 1 wt. % and about 4 wt. %, preferably between about 2 wt. % and about 3 wt. %, the process therefore offering the capability to plate Sn—Ag alloys having a wide range of melting points between about 221° C. and about 226° C. The Sn—Ag solder wafer bumps are plated with substantially reduced or eliminated voiding between the bump and the Cu UBM. Moreover, because of the $Ag^-$ ion stabilizing components of the baths of the present invention, the Ag metal is distributed uniformly in the Sn—Ag alloys. This uniformity is important for successful reflow. It also ensures that the bump properties and mechanical strength are uniform across the wafer or other substrate.

The following examples further illustrate the present invention.

Example 1

Sn—Ag Solder Wafer Bump Electroplating Bath and Method of Preparation

A Sn—Ag bath for electroplating Sn—Ag alloy solder wafer bumps was prepared comprising the following components:
2.22 g/L HEAT
60 g/L $Sn^{2+}$ as 156 g/L $Sn(MSA)_2$
0.5 g/L $Ag^+$ as 0.94 g/L Ag(MSA)
100 mL/L MSA (70% solution)
2 g/L Hydroquinone
7.0 g/L of Lugalvan BNO12
1.6 g/L of Dodigen 226
pH 0

Optionally, the bath may comprise 0.5 grams per liter of Defoamer SF.

One liter of this bath was prepared according to the following protocol:
1) Water (about 400 mL) added to a 1 L flask.
2) MSA (100 mL of 70% solution) added and solution stirred.
3) HEAT (2.22 g) added and solution stirred for about 5 minutes.
4) Ag(MSA) (0.84 g) added and solution stirred for about 5 minutes.
5) Hydroquinone (2 g) added and solution stirred for about 5 minutes.
6) $Sn(MSA)_2$ (156 g) added and solution stirred for about 5 minutes.
7) Lugalvan BNO12 (7.0 g) added and solution stirred for about 5 minutes.
8) With vigorous mixing, Dodigen 226 (1.6 g in aqueous solution) added dropwise.
9) Add water to 1 L.

This mixing order has been discovered to advantageously result in increased stability. In particular, mixing the complexing agent and the Ag source together and providing a period of mixing prior to adding the Sn source, and prior to adding the surfactant, has been found to increase stability. It preliminarily appears to provide advantages in complexing to allow early intimate contact between the complexor and the $Ag^+$ ions prior to the introduction of certain other ingredients. Accordingly, this preferred process involves combining the source of $Ag^+$ ions with the complexor for $Ag^+$ ions and water to form a bath precursor comprising $Ag^+$ ion complex in a substantial absence of the source of $Sn^{+2}$ ions. By "substantial absence" it is meant that 90% or more of the overall source of $Sn^{+2}$ ions is not added until after intimate mixing of the complexor and the source of $Ag^+$ ions. It is also seen that in this preferred embodiment, the bath precursor is substantially free of surfactant, and the process involves adding the surfactant to the bath precursor after formation of the Ag complex.

Example 2

Sn—Ag Solder Wafer Bump Electroplating Bath

Another Sn—Ag plating bath was prepared comprising the following components:
1.75 g/L HEAT
60 g/L $Sn^{2+}$ as 156 g/L $Sn(MSA)_2$
0.5 g/L $Ag^+$ as 0.94 g/L Ag(MSA)
100 mL/L MSA (70% solution)
2 g/L Hydroquinone
7.0 g/L of Lugalvan BNO12
1.6 g/L of Dodigen 226.

Example 3

Sn—Ag Solder Wafer Bump Electroplating Bath

Another bath was prepared comprising the following components:
2.22 g/L HEAT
60 g/L $Sn^{2+}$ as 156 g/L $Sn(MSA)_2$
0.5 g/L $Ag^+$ as 0.94 g/L Ag(MSA)

100 mL/L MSA (70% solution)
2 g/L Hydroquinone
7.0 g/L of Lugalvan BNO12
1.6 g/L of Dodigen 226
0.5 g/L of Defoamer SF.

Example 4

Sn—Ag Solder Wafer Bump Electroplating Bath

Another bath was prepared comprising the following components:
1.4 g/L HEAT
60 g/L $Sn^{2+}$ as 156 g/L $Sn(MSA)_2$
0.5 g/L $Ag^+$ as 0.94 g/L Ag(MSA)
140 mL/L MSA (70% solution)
2 g/L Hydroquinone
6.7 g/L of Lugalvan BNO12
0.8 g/L of Dodigen 226.

Example 5

Sn—Ag Solder Wafer Bump Electroplating Bath

Another bath was prepared comprising the following components:
8 g/L HEAT
60 g/L $Sn^{2+}$ as 156 g/L $Sn(MSA)_2$
0.5 g/L $Ag^+$ as 0.94 g/L Ag(MSA)
160 mL/L MSA (70% solution)
2 g/L Hydroquinone
8 g/L Ralufon NAPE 1490.

Example 6

Sn—Ag Solder Wafer Bump Electroplating Bath

Another bath was prepared comprising the following components:
6 g/L HEAT
40 g/L $Sn^{2+}$ as 104 g/L $Sn(MSA)_2$
0.4 g/L $Ag^+$ as 0.75 g/L Ag(MSA)
300 mL/L MSA (70% solution)
2 g/L Hydroquinone
8 g/L Ralufon NAPE 1490.

Example 7

Sn—Ag Solder Wafer Bump Electroplating Bath

Another bath was prepared comprising the following components:
3 g/L N,N'-Diethylthiourea (DETU)
60 g/L $Sn^{2+}$ as 156 g/L $Sn(MSA)_2$
0.5 g/L $Ag^+$ as 0.94 g/L Ag(MSA)
180 mL/L MSA (70% solution)
2 g/L Hydroquinone
7 g/L Lugalvan BNO 12
2 g/L Dodigen 226.

Example 8

Sn—Ag Solder Wafer Bump Electroplating Bath

Another bath was prepared comprising the following components:
1.5 g Amidinothiourea
60 g/L $Sn^{2+}$ as 156 g/L $Sn(MSA)_2$
1 g/L $Ag^+$ as 1.88 g/L Ag(MSA)
180 mL/L MSA (70% solution)
2 g/L Hydroquinone.

Example 9

Sn—Ag Solder Wafer Bump Electroplating Bath

Another bath was prepared comprising the following components:
3 g/L N,N'-Dimethylthiourea
30 g/L $Sn^{2+}$ as 78 g/L $Sn(MSA)_2$
0.3 g/L $Ag^+$ as 0.56 g/L Ag(MSA)
150 mL/L MSA (70% solution)
2 g/L Hydroquinone
8 g/L Ralufon NAPE 1490.

Example 10

Sn—Ag Solder Wafer Bump Electroplating Bath

Another bath was prepared comprising the following components:
4 g/L N-Allyl-thiourea
60 g/L $Sn^{2+}$ as 156 g/L $Sn(MSA)_2$
0.5 g/L $Ag^+$ as 0.94 g/L Ag(MSA)
100 mL/L MSA (70% solution)
2 g/L Hydroquinone
7 g/L Lugalvan BNO 12
2 g/L Dodigen 226.

Example 11

Sn—Ag Solder Wafer Bump Deposition

Sn—Ag wafer bumps were plated on Cu UBM using the bath of Example 1. The silicon wafer and Cu UBM die pattern was prepared as described above. Un-crosslinked photo resistant material was stripped from the wafer using methylene chloride and ultrasonic agitation for between 30 and 60 minutes. Cu metallization was etched by a solution comprising deionized water (60 mL), ammonium hydroxide (60 mL, 20 to 24% solution), and hydrogen peroxide (10 mL, 3% solution).

Figure 1B:
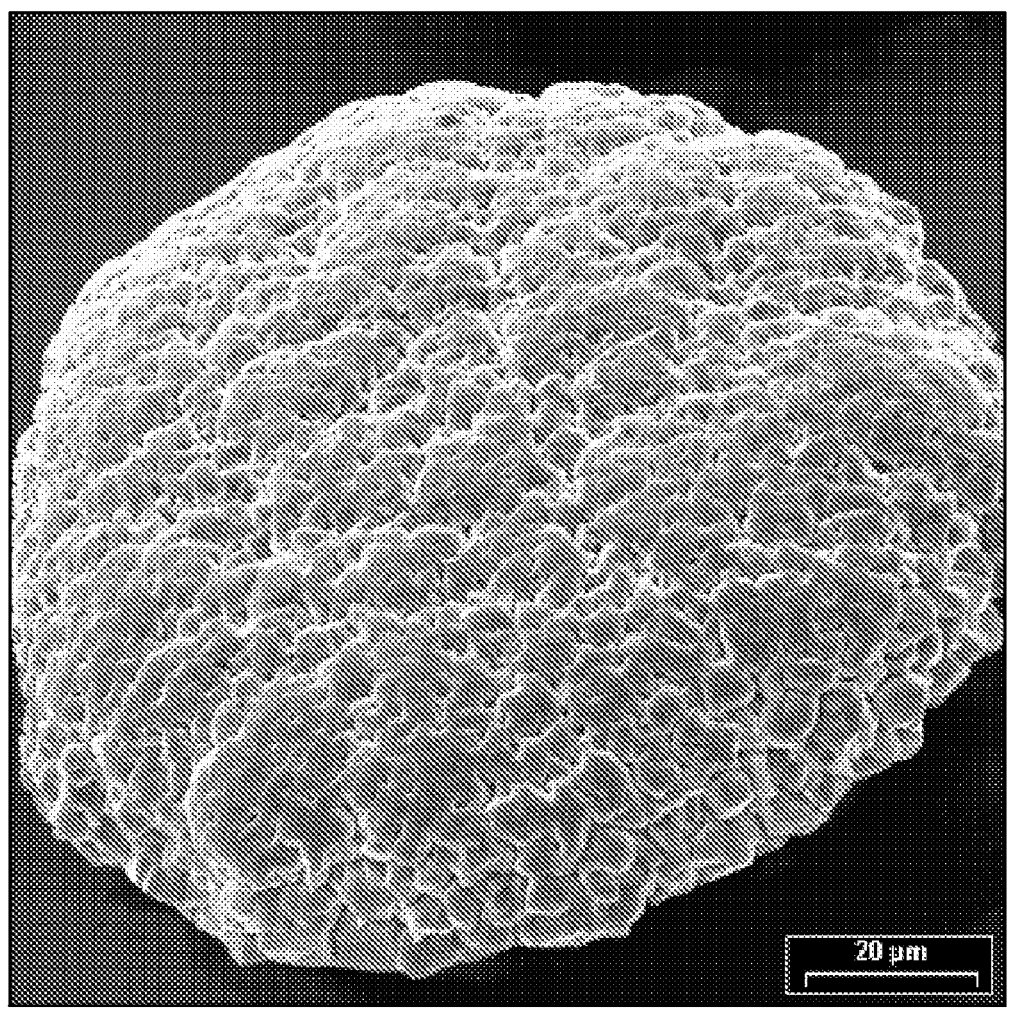
Figure 1C:
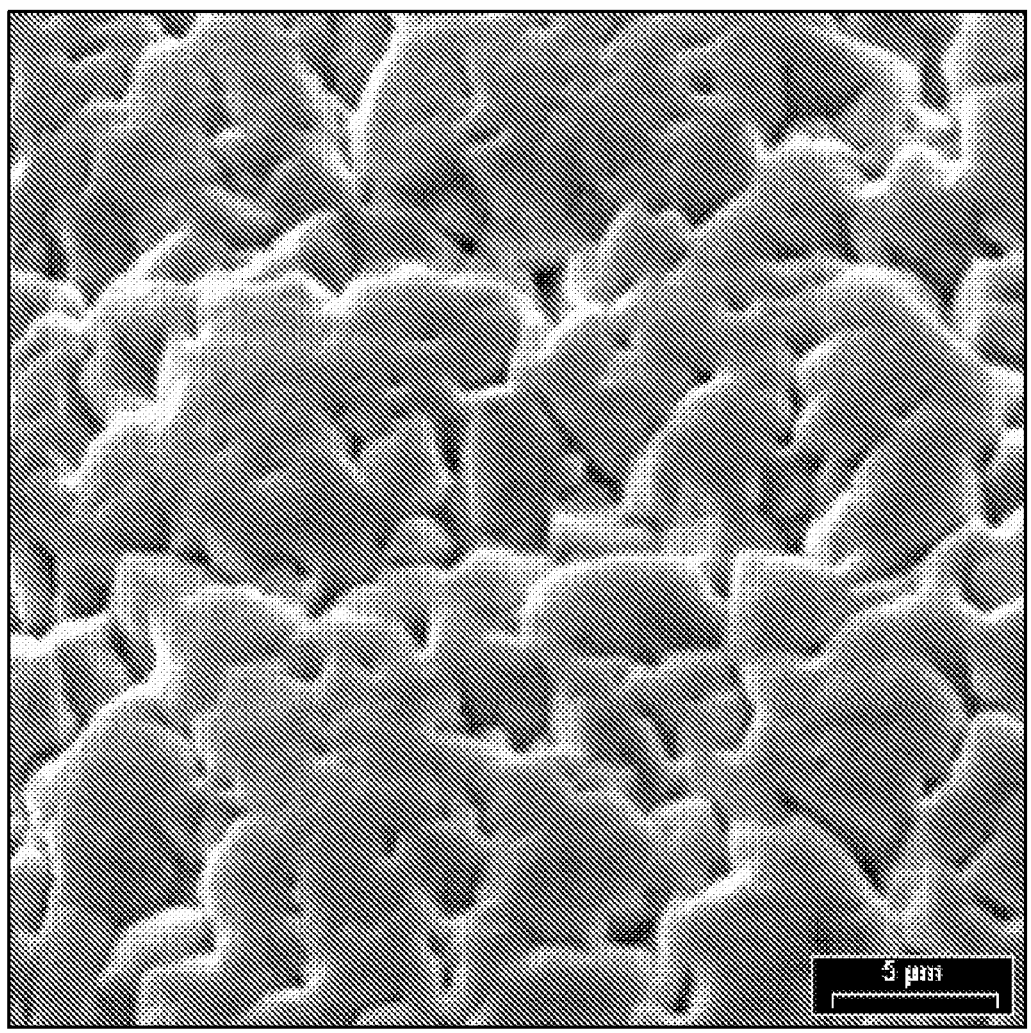
Figure 3A:
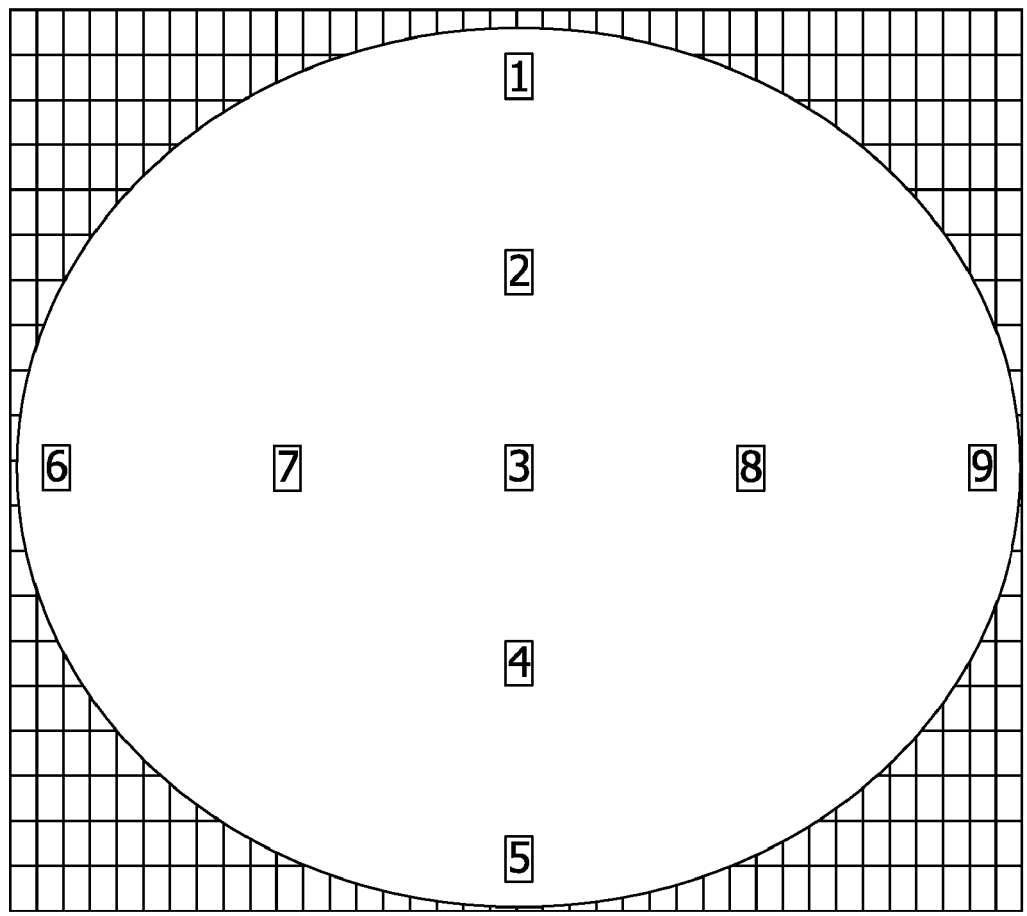
FIG. 3A shows a wafer having a patterned distribution of dies.
Figure 3B:
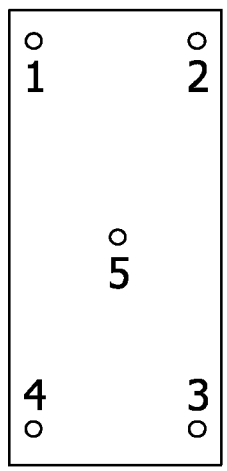
FIG. 3B shows the measurement position of 5 wafer bumps within each die.

Sn—Ag solder wafer bumps were plated from the bath of Example 1 onto dies on patterned silicon wafer. The die positions on the wafer and bump positions within each die are shown in FIGS. 3A and 3B. The bumps were plated at 12 ASD. Bump height distribution was measured by surface profilometry (DEKTAK 8000). Table I shows bump height distribution data obtained from the profilometer. Bump composition was measured by SEM/EDS (20 kV). Table II shows the Ag content (in wt. %) data obtained by SEM/EDS. Wafer bump topography was measured using SEM (20 kV, 45° tilt). FIGS. 1A, 1B, 1C are SEM photographs showing the Sn—Ag solder wafer bumps as deposited at 200×, 800×, and 3000× magnification, respectively. For each measurement technique, 5 bumps (bump pattern shown in FIG. 3B and designated 1, 2, 3, 4, and 5 in the horizontal axes in Tables I and II below) were analyzed at each of 3 die positions (die pattern shown in FIG. 3A and designated 3, 6, 7 in the vertical axes in Tables I and II below).

TABLE I

Sn—Ag Solder Bump Height Measurements
Plating Conditions: 12 ASD, 0.8 Hours

| | Measured Bumps (μm) | | | | | |
|---|---|---|---|---|---|---|
| Die No. | 1 | 2 | 3 | 4 | 5 | Die Average |
| 3 | 64.0 | 62.0 | 64.0 | 62.0 | 58.0 | 62.0 |
| 6 | 64.0 | 63.0 | 64.0 | 65.0 | 58.0 | 62.8 |
| 7 | 64.0 | 62.0 | 64.0 | 64.0 | 59.0 | 62.6 |
| Maximum Height (μm) | Minimum Height (μm) | Range (μm) | Average Height (μm) | Standard Deviation (μm) | Range/Average (%) | Deviation/Average (%) |
| 65.0 | 58.0 | 7.0 | 62.5 | 2.3 | 11.2 | 3.7 |

TABLE II

Sn—Ag Solder Bump Ag Content Measurements
Plating Conditions: 12 ASD, 0.8 Hours

| | Measured Bumps (Ag wt. %) | | | | | |
|---|---|---|---|---|---|---|
| Die No. | 1 | 2 | 3 | 4 | 5 | Die Average |
| 3 | 2.35 | 2.26 | 2.99 | 3.15 | 2.52 | 2.65 |
| 6 | 1.80 | 2.39 | 1.78 | 1.54 | 2.15 | 1.93 |
| 7 | 2.85 | 2.80 | 2.25 | 2.25 | 2.33 | 2.50 |
| Maximum (Ag wt. %) | Minimum (Ag wt. %) | Range (Ag wt. %) | Average (Ag wt. %) | Standard Deviation (Ag wt. %) | Range/Average (%) | Deviation/Average (%) |
| 3.15 | 1.54 | 1.61 | 2.36 | 0.45 | 68.20 | 19.22 |

Example 12

Sn—Ag Solder Wafer Bump Reflow

Figure 2A:
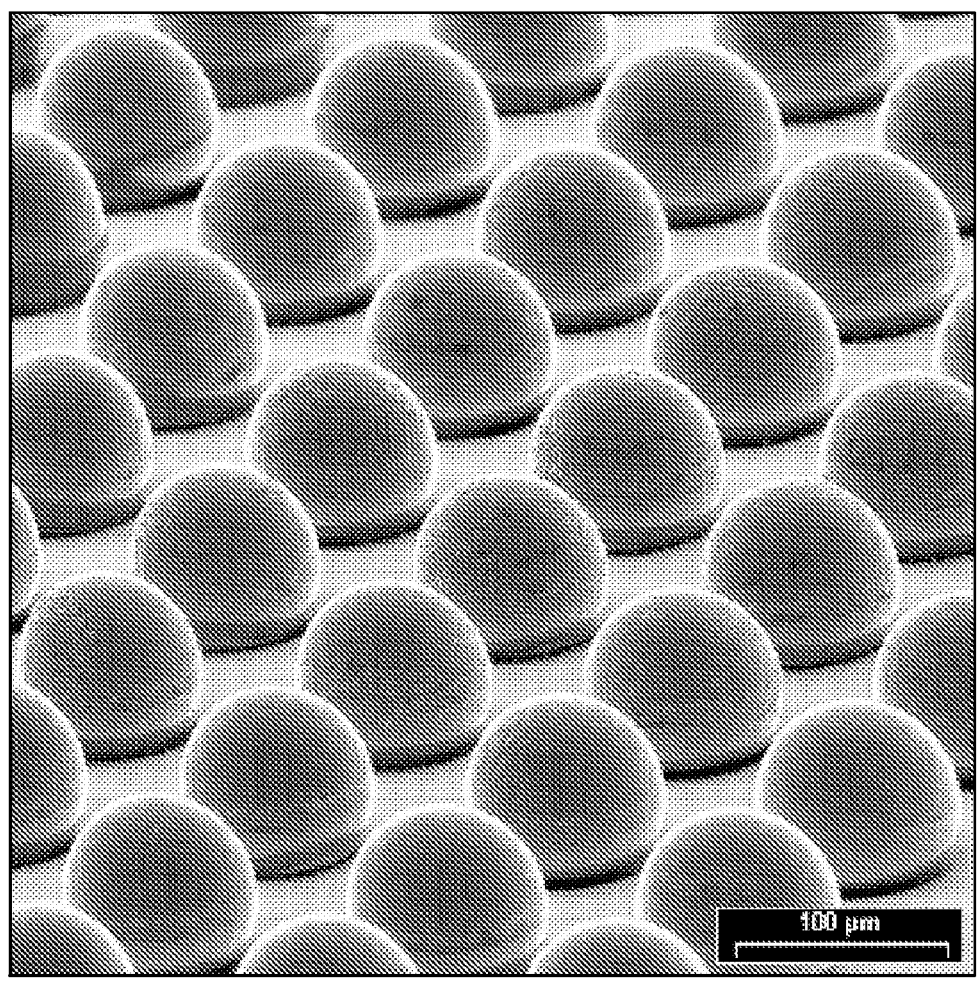
FIGS. 2A, 2B, and 2C are SEM photographs of reflowed solder bumps prepared according to the method described in Example 12.
Figure 2B:
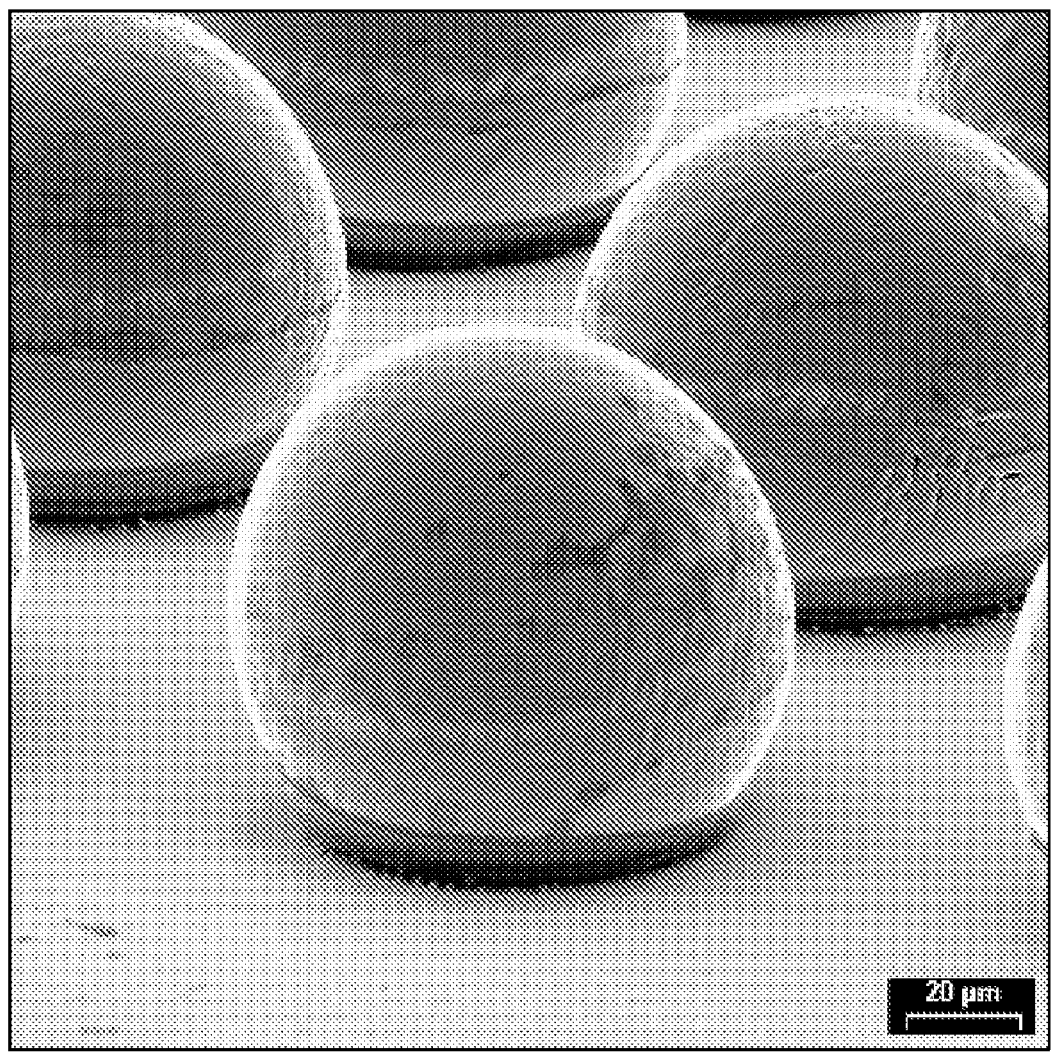
Figure 2C:
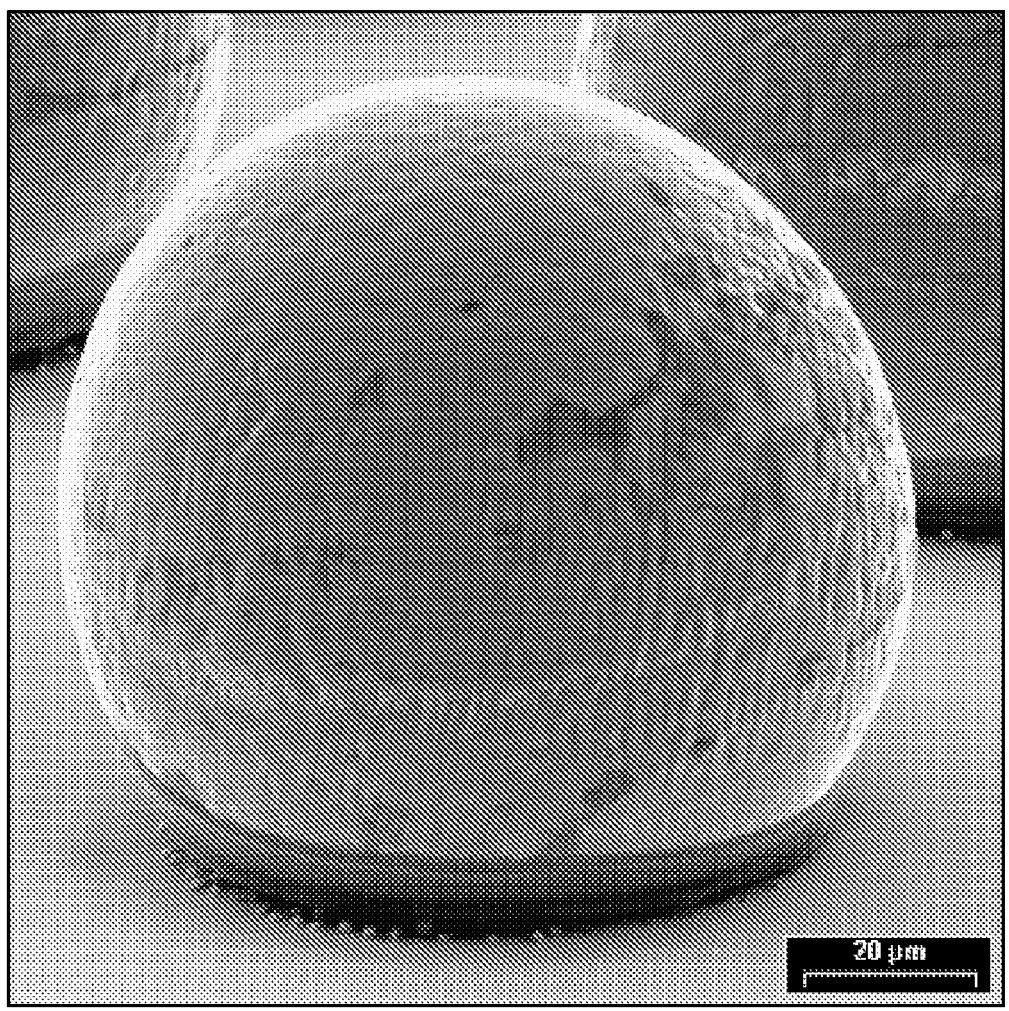

The Sn—Ag solder wafer bumps of Example 3 were reflowed using a hot plate in a glove box. Steps:

1. Flux application: Lonco 3355-11
2. Preheat: to evaporate volatiles, allow flux to activate, and bond to surface
3. Reflow: temperature of hot plate is 260° C. and nitrogen atmosphere.
4. Cooling: air cooling Reflowed wafer bumps were photographed using SEM (20 kV, 75° tilt). FIGS. 2A, 2B, 2C are SEM photographs showing reflowed Sn—Ag solder wafer bumps as deposited at 200×, 800×, and 3000× magnification, respectively. The reflowed bumps are smooth and show a uniform ball shape, and demonstrate zero voiding.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "a" wafer bump means that there are one or more such bumps. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. An electroplating composition for plating a Sn—Ag solder bump comprising:
   a source of $Sn^{2+}$ ions;
   a source of $Ag^+$ ions;
   a N-allyl-thiourea compound having a formula (I):

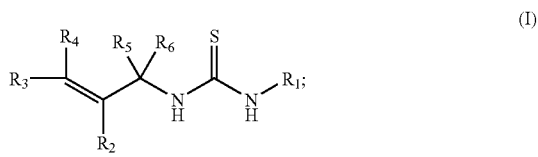

wherein $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl and $R_1$ is —$CH_2CH_2OH$ (β-hydroxyethyl); and
   a quaternary ammonium surfactant.

2. A process for forming a solder bump on an under bump metal structure in the manufacture of a microelectronic device, the process comprising:
   exposing the under bump metal structure to an electrolytic bath comprising a source of $Sn^{2+}$ ions, a source of $Ag^+$ ions, and an N-allyl-thiourea compound having a formula (I):

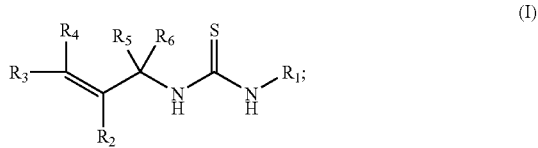

wherein $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl and $R_1$ is —$CH_2CH_2OH$ (β-hydroxyethyl); and
   supplying an external source of electrons to the electrolytic bath to deposit a Sn—Ag alloy onto the under bump metal structure.

3. The process of claim 2 wherein $R_2$, $R_3$, $R_4$, $R_5$, and $R_6$ are hydrogen.

4. The process of claim 2 wherein the N-allyl-thiourea compound has a concentration between about 0.5 g/L and about 24 g/L.

5. The process of claim 2 wherein the N-allyl-thiourea compound has a concentration between about 1 g/L and about 8 g/L.

6. The process of claim 2 wherein the supplying the external source of electrons employs a current density of at least about 8 A/dm$^2$.

7. The process of claim 2 wherein the supplying the external source of electrons employs a current density between about 8 A/dm$^2$ and about 20 A/dm$^2$.

8. The process of claim 2 wherein the electrolytic bath further comprises an alkyl dimethyl benzyl ammonium surfactant.

9. The process of claim 2 wherein the electrolytic bath further comprises a β-naphthol derivative.

10. The process of claim 2 wherein the electrolytic bath further comprises hydroquinone.

11. The process of claim 2 wherein the electrolytic bath further comprises a quaternary ammonium surfactant and a β-naphthol derivative.

12. The process of claim 2 wherein the electrolytic bath further comprises a quaternary ammonium surfactant, a β-naphthol derivative, and hydroquinone.

13. The process of claim 2 wherein the electrolytic bath comprises:
- between about 0.5 g/L and about 24 g/L of the N-allyl-thiourea compound;
- the Sn$^{2+}$ ions in a concentration between about 10 g/L and about 100 g/L; and
- the Ag$^+$ ions in a concentration between about 0.1 g/L and about 1.5 g/L.

14. The process of claim 13 wherein the supplying the external source of electrons employs a current density between about 8 A/dm$^2$ and about 20 A/dm$^2$.

15. The process of claim 2 wherein the electrolytic bath further comprises a β-naphtholethoxylate comprising between 8 and 16 ethylene oxide monomer units.

16. A process for forming a solder bump on an under bump metal structure in the manufacture of a microelectronic device, the process comprising:
exposing the under bump metal structure to an electrolytic bath comprising a source of Sn$^{2+}$ ions, a source of Ag$^+$ ions, and an N-allyl-thiourea compound having a formula (I):

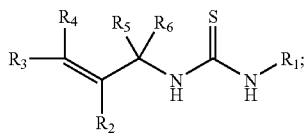

wherein $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl and $R_1$ is —CH$_2$CH$_2$OH (β-hydroxyethyl), and a quaternary ammonium surfactant; and
supplying an external source of electrons to the electrolytic bath to deposit a Sn—Ag alloy onto the under bump metal structure.

17. A process for forming a solder bump on an under bump metal structure in the manufacture of a microelectronic device, the process comprising:
exposing the under bump metal structure to an electrolytic bath comprising a source of Sn$^{2+}$ ions, a source of Ag$^+$ ions, an N-allyl-thiourea compound having a formula (I):

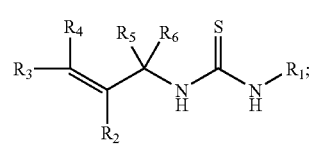

wherein $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl and $R_1$ is —CH$_2$CH$_2$OH (β-hydroxyethyl), lauryl benzyl dimethyl ammonium chloride and myristyl benzyl dimethyl ammonium chloride; and
supplying an external source of electrons to the electrolytic bath to deposit a Sn—Ag alloy onto the under bump metal structure.

18. A process for forming a solder bump on an under bump metal structure in the manufacture of a microelectronic device, the process comprising:
exposing the under bump metal structure to an electrolytic bath comprising a source of Sn$^{2+}$ ions, a source of Ag$^+$ ions, and an N-allyl-thiourea compound having a formula (I):

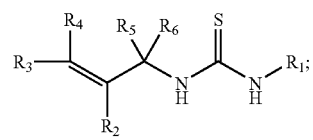

wherein $R_2$, $R_3$, $R_4$, $R_5$, and $R_6$ are each independently hydrogen, hydroxyl, hydrocarbyl, substituted hydrocarbyl, heterocycloalkyl, substituted heterocycloalkyl, alkoxy, substituted alkoxy, aryl, substituted aryl, heteroaryl, or substituted heteroaryl and $R_1$ is —CH$_2$CH$_2$OH (β-hydroxyethyl), and a sulfonated β-naphthol propoxylate/ethoxylate; and
supplying an external source of electrons to the electrolytic bath to deposit a Sn—Ag alloy onto the under bump metal structure.

19. A process for forming a solder bump on an under bump metal structure in the manufacture of a microelectronic device, the process comprising:
exposing the under bump metal structure to an electrolytic bath comprising a source of Sn$^{2+}$ ions, a source of Ag$^+$ ions, and a quaternary ammonium surfactant wherein the quaternary ammonium surfactant comprises lauryl benzyl dimethyl ammonium chloride and myristyl benzyl dimethyl ammonium chloride; and
supplying an external source of electrons to the electrolytic bath to deposit a Sn—Ag alloy onto the under bump metal structure.

20. The process of claim 19 further comprising a N-allyl-thiourea compound.

21. The process of claim 20 wherein the N-allyl-thiourea compound is N-allyl-thiourea.

22. The process of claim 20 wherein the N-allyl-thiourea compound is N-allyl-N'-β-hydroxyethyl-thiourea.

23. The process of claim 19 wherein the supplying the external source of electrons employs a current density between about 8 A/dm$^2$ and about 20 A/dm$^2$.

24. The process of claim 19 wherein the electrolytic bath further comprises a β-naphthol derivative.

25. The process of claim 19 wherein the electrolytic bath further comprises a β-naphtholethoxylate, a sulfonated β-naphthol propoxylate/ethoxylate, or a combination thereof.

26. The process of claim 19 wherein the electrolytic bath further comprises hydroquinone.

27. The process of claim 19 wherein the electrolytic bath further comprises an N-allyl-thiourea compound and a β-naphthol derivative.

28. The process of claim 19 wherein the electrolytic bath further comprises an N-allyl-thiourea compound, a β-naphthol derivative, and hydroquinone.

* * * * *